(12) United States Patent
Lee et al.

(10) Patent No.: US 11,251,041 B2
(45) Date of Patent: Feb. 15, 2022

(54) SUBSTRATE, INTEGRATED CIRCUIT DEVICE INCLUDING THE SUBSTRATE, AND METHOD OF MANUFACTURING THE INTEGRATED CIRCUIT DEVICE

(71) Applicant: SAMSUNG ELECTRONICS CO., LTD., Suwon-si (KR)

(72) Inventors: In-Ji Lee, Seoul (KR); Doek-Gil Ko, Yongin-si (KR); Yeon-sook Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 1 day.

(21) Appl. No.: 16/292,566

(22) Filed: Mar. 5, 2019

(65) Prior Publication Data

US 2020/0043728 A1   Feb. 6, 2020

(30) Foreign Application Priority Data

Aug. 2, 2018   (KR) .......................... 10-2018-0090407

(51) Int. Cl.
| | |
|---|---|
| *H01L 21/02* | (2006.01) |
| *H01L 29/78* | (2006.01) |
| *H01L 29/04* | (2006.01) |
| *H01L 29/66* | (2006.01) |

(52) U.S. Cl.
CPC .. *H01L 21/02433* (2013.01); *H01L 21/02381* (2013.01); *H01L 29/045* (2013.01); *H01L 29/66795* (2013.01); *H01L 29/7853* (2013.01); *H01L 21/0262* (2013.01); *H01L 21/02532* (2013.01); *H01L 21/02543* (2013.01); *H01L 21/02546* (2013.01)

(58) Field of Classification Search
CPC ............. H01L 29/045; H01L 29/66795; H01L 21/02433; H01L 21/0243; H01L 29/45
See application file for complete search history.

(56) References Cited

U.S. PATENT DOCUMENTS

| | | | |
|---|---|---|---|
| 7,357,839 B2 | 4/2008 | Takano et al. | |
| 7,989,073 B2* | 8/2011 | Dohi | ....................... C30B 25/20 |
| | | | 428/446 |
| 8,399,915 B2 | 3/2013 | Takaishi | |
| 8,492,879 B2* | 7/2013 | Ohmi | ................ H01L 21/02381 |
| | | | 257/255 |
| 8,519,436 B2 | 8/2013 | Lochtefeld et al. | |
| 8,759,944 B2 | 6/2014 | Wells et al. | |
| 2006/0131553 A1* | 6/2006 | Yamanaka | ........ H01L 21/02027 |
| | | | 257/1 |
| 2008/0164572 A1 | 7/2008 | Toyoda et al. | |

(Continued)

FOREIGN PATENT DOCUMENTS

| | | |
|---|---|---|
| JP | 2008-91891 A | 4/2008 |
| JP | 2008-109011 A | 5/2008 |

(Continued)

*Primary Examiner* — Sarah K Salerno
(74) *Attorney, Agent, or Firm* — Sughrue Mion, PLLC

(57) ABSTRACT

A semiconductor substrate includes a main surface inclined by a first off-angle greater than 0° from a first direction parallel to a crystal plane, with respect to the crystal plane, in a first radial direction of the main surface, and a notch disposed toward the first direction, at an edge of the main surface in the first radial direction.

14 Claims, 17 Drawing Sheets

(56) References Cited

U.S. PATENT DOCUMENTS

| | | | | |
|---|---|---|---|---|
| 2014/0027787 | A1* | 1/2014 | Gunjishima | C30B 23/025 |
| | | | | 257/77 |
| 2015/0380411 | A1* | 12/2015 | Yin | H01L 21/265 |
| | | | | 257/369 |
| 2016/0233164 | A1* | 8/2016 | Choi | H01L 29/785 |
| 2019/0030651 | A1* | 1/2019 | Sekiya | B23K 26/0869 |

FOREIGN PATENT DOCUMENTS

| | | |
|---|---|---|
| JP | 2008-177529 A | 7/2008 |
| JP | 4178989 B2 | 11/2008 |
| JP | 4239676 B2 | 3/2009 |
| JP | 2009-94156 A | 4/2009 |
| JP | 4423903 B2 | 3/2010 |

\* cited by examiner

B - B'

B – B'

SUBSTRATE, INTEGRATED CIRCUIT DEVICE INCLUDING THE SUBSTRATE, AND METHOD OF MANUFACTURING THE INTEGRATED CIRCUIT DEVICE

CROSS-REFERENCE TO RELATED APPLICATION

This application claims priority from Korean Patent Application No. 10-2018-0090407, filed on Aug. 2, 2018, in the Korean Intellectual Property Office, the disclosure of which is incorporated herein by reference in its entirety.

BACKGROUND

1. Field

Apparatuses and methods consistent with embodiments relate to a substrate, an integrated circuit device including the substrate, and a method of manufacturing the integrated circuit device, and more particularly, to a semiconductor substrate, a semiconductor epitaxial substrate, an integrated circuit device including the semiconductor epitaxial substrate, and a method of manufacturing the integrated circuit device.

2. Description of Related Art

Due to the advances in electronics, integrated circuit devices have been rapidly down-scaled. Because integrated circuit devices require not only fast operation speed but also accuracy with respect to operation, various studies have been conducted to optimize the structures of transistors included in integrated circuit devices. Particularly, there is a need to develop a technique for suppressing crystal defects and faults caused by the crystal defects in integrated circuit devices manufactured using a single crystal semiconductor substrate.

SUMMARY

According to embodiments, a semiconductor substrate includes a main surface inclined by a first off-angle greater than 0° from a first direction parallel to a crystal plane, with respect to the crystal plane, in a first radial direction of the main surface, and a notch disposed toward the first direction, at an edge of the main surface in the first radial direction.

According to embodiments, an integrated circuit device includes a semiconductor substrate including a main surface inclined by a first off-angle greater than 0° from a first direction parallel to a crystal plane, with respect to the crystal plane, in a first radial direction of the main surface. The main surface is parallel to the crystal plane, in a second radial direction perpendicular to the first radial direction. The integrated circuit further includes a fin-type active region disposed on the main surface, and has a major axis parallel to the first radial direction and a minor axis parallel to the second radial direction. The fin-type active region includes an upper surface including an atomic level step, and the atomic level step extends parallel to the second radial direction.

According to embodiments, a method of manufacturing an integrated circuit device, includes forming a fin-type active region having a major axis parallel to a first radial direction, on a semiconductor substrate. The semiconductor substrate includes a main surface inclined by a first off-angle greater than 0° from a first direction parallel to a crystal plane, with respect to the crystal plane, in the first radial direction of the main surface, and a notch formed toward the first direction, at an edge of the main surface in the first radial direction.

According to embodiments, a semiconductor substrate includes a main surface inclined by a first off-angle greater than 0° from a first direction parallel to a crystal plane, with respect to the crystal plane, in a first radial direction of the main surface. The main surface is parallel to the crystal plane, in a second radial direction perpendicular to the first radial direction.

DETAILED DESCRIPTION OF THE EMBODIMENTS

The inventive concept provides a semiconductor substrate having a structure suitable for use in a highly reliable integrated circuit device manufacturing process.

The inventive concept provides a semiconductor epitaxial substrate having surface characteristics capable of suppressing crystal defects and the occurrence of faults.

The inventive concept provides an integrated circuit device having excellent performance and improved reliability by including a semiconductor epitaxial substrate having surface characteristics capable of suppressing crystal defects and the occurrence of faults.

The inventive concept provides a method of manufacturing an integrated circuit device having excellent performance and improved reliability by using a semiconductor epitaxial substrate having surface characteristics capable of suppressing crystal defects and the occurrence of faults.

Figure 1A:
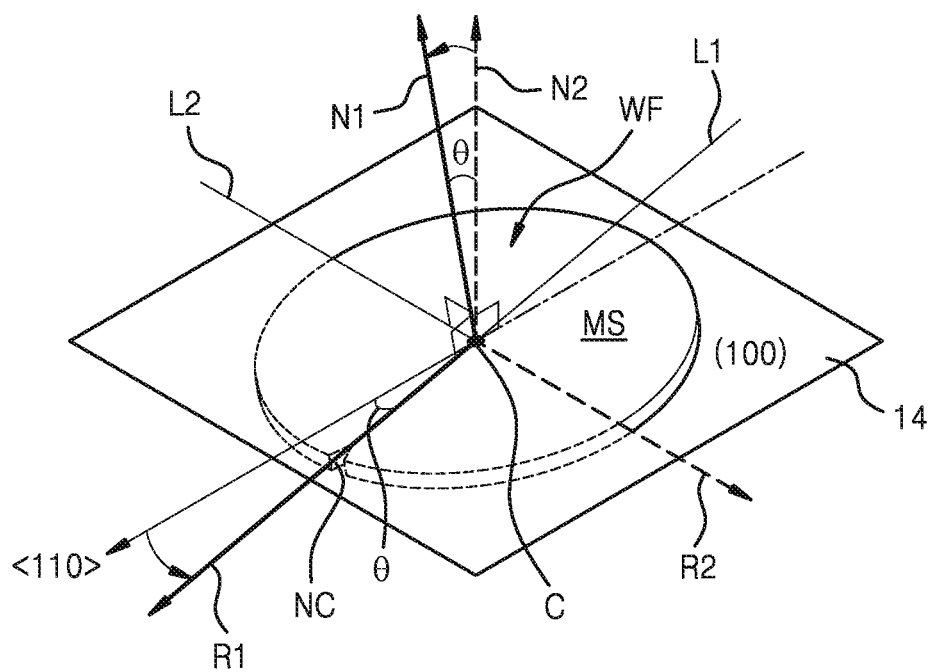
FIG. 1A is a perspective view illustrating a semiconductor substrate according to embodiments.
Figure 1B:
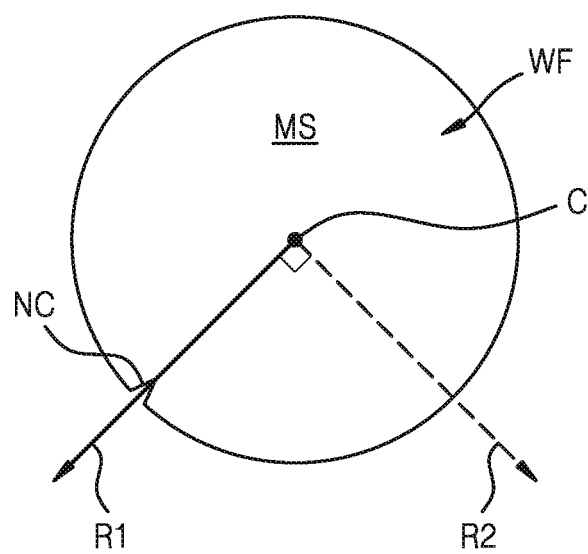
FIG. 1B is a plan view of the semiconductor substrate shown in FIG. 1A.

FIG. 1A is a perspective view illustrating a semiconductor substrate WF according to embodiments, and FIG. 1B is a plan view of the semiconductor substrate WF shown in FIG. 1A.

Referring to FIGS. 1A and 1B, the semiconductor substrate WF includes a main surface MS and a notch NC. The main surface MS is inclined by a first off-angle θ that is greater than 0° in a <110> direction (a first direction) parallel to a (100) crystal plane, with respect to a reference plane 14 composed of the (100) crystal plane in a first radial direction (an arrow R1 direction) of the semiconductor substrate WF. The notch NC is formed toward the <110> direction at an edge of the main surface MS in the first radial direction (the arrow R1 direction).

The term "off-angle" used in the present specification means the smallest angle among angles formed by the (100) crystal plane and the main surface MS of the semiconductor substrate WF. Although only the "notch" is described in the present specification, the inventive concept is not limited to the notch and may be equally applied to a flat zone or an orientation flat.

Figure 2:
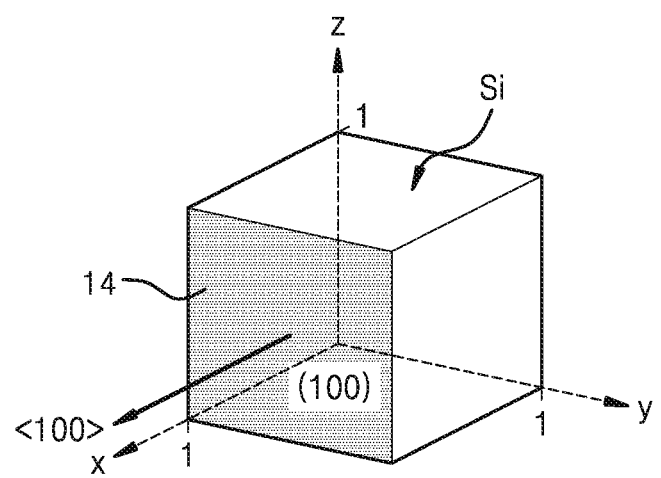
FIG. 2 is a view illustrating a reference plane shown in FIG. 1A.

FIG. 2 is a view illustrating the (100) crystal plane constituting the reference plane 14 shown in FIG. 1A.

Referring to FIGS. 1A and 2, the reference plane 14 composed of the (100) crystal plane is a plane that intersects the value 1 on the x-axis and does not intersect the y-axis and the z-axis in a cubic system silicon (Si). In FIG. 2, a <100> direction is a direction perpendicular to the (100) crystal plane.

Referring again to FIGS. 1A and 1B, in embodiments, the first off-angle θ may be equal to or greater than 0.2° and less than 7.3°. In the case in which the first off-angle θ is less than 0.2°, when a semiconductor epitaxial layer is formed on the main surface MS of the semiconductor substrate WF, a haze level may be higher than an allowable range due to the diffused reflection of light on the surface of the semiconductor epitaxial layer. In the case in which the first off-angle θ is equal to or greater than 7.3°, the crystal plane characteristics of the main surface MS of the semiconductor substrate WF may have a surface characteristic that is different from (100) crystal plane characteristics.

In the main surface MS of the semiconductor substrate WF, an angle between the first radial direction (an arrow R1 direction) toward the notch NC and a <110> direction toward the notch NC among <110> directions of the reference plane 14 may be the first off-angle θ. In other words, in the main surface MS of the semiconductor substrate WF, an angle between a radial direction toward the opposite side of the notch NC (that is, a radial direction opposite to the first radial direction (the arrow R1 direction)) and the <110> direction toward the notch NC among <110> directions of the reference plane 14 may be the first off-angle θ plus 180°. Therefore, when the first off-angle θ is equal to or greater than 0.2° and less than 7.3°, an angle between the radial direction toward the opposite side of the notch NC and the <110> direction toward the notch NC among the <110> directions of the reference plane 14 may be equal to or greater than 180.2° and less than 180.7°.

According to the inventive concept, by making the first off-angle θ of the semiconductor substrate WF be equal to or greater than 0.2° and less than 7.3°, a heat treatment process or a high temperature process for restoring crystallinity of the semiconductor epitaxial layer formed on the semiconductor substrate WF may be minimized in the process of manufacturing an integrated circuit device using the semiconductor substrate WF. Therefore, the process of manufacturing the integrated circuit device may be simplified, process stability may be improved, and manufacturing cost may be lowered.

A first straight line L1 passing through a center C of the main surface MS of the semiconductor substrate WF and the notch NC may be inclined by the first off-angle θ from a straight line in the <110> direction parallel to the reference plane 14.

The first straight line L1 passing through the center C of the main surface MS of the semiconductor substrate WF and the notch NC may be inclined by the first off-angle θ from a straight line extending in a <110> direction parallel to the (100) crystal plane from the center C of the main surface MS.

A first normal N1 to the main surface MS of the semiconductor substrate WF may be inclined by the first off-angle θ in a direction toward the notch NC from a second normal N2 to the reference plane 14.

In a second radial direction (an arrow R2 direction) perpendicular to the first radial direction (the arrow R1 direction) passing through the notch NC, a second off-angle of the main surface MS with respect to the reference plane 14 may be 0°. Therefore, the main surface MS of the semiconductor substrate WF may extend parallel to the reference plane 14 in a direction parallel to a second straight line L2 in the second radial direction (the arrow R2 direction).

In embodiments, the semiconductor substrate WF may include a Si single crystal substrate.

Figure 3A:
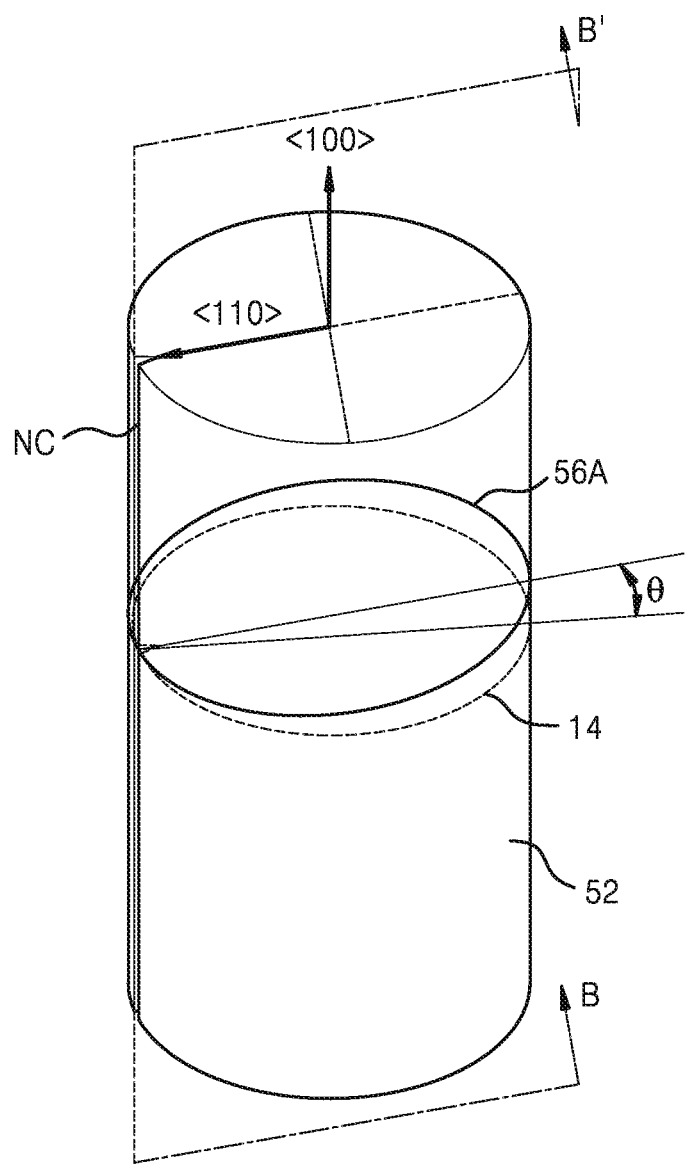
FIG. 3A is a perspective view illustrating a method of manufacturing a semiconductor substrate, according to embodiments.
Figure 3B:
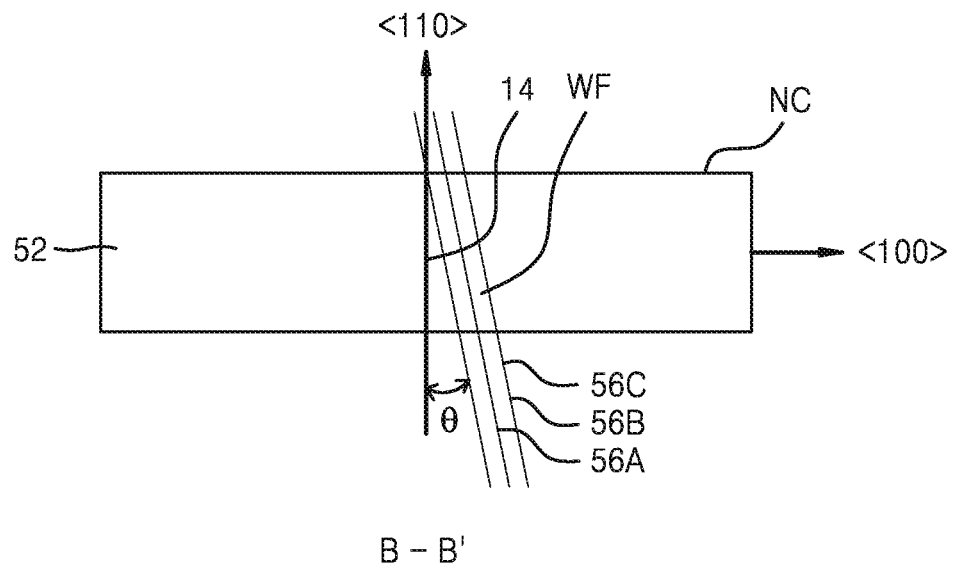
FIG. 3B is a cross-sectional view taken along a line B-B' in FIG. 3A.

FIG. 3A is a perspective view illustrating a method of manufacturing a semiconductor substrate WF, according to embodiments, and FIG. 3B is a cross-sectional view taken along a line B-B' in FIG. 3A.

Referring to FIGS. 3A and 3B, an ingot 52 grown in a <100> direction and having a notch NC formed in a <110> direction and extending along a longitudinal direction on the outer circumference is prepared. In embodiments, the ingot 52 may be a cylindrical silicon single crystal ingot formed by a crystal growth method such as a Czochralski (CZ) method. In the present specification, the notch NC formed in the ingot 52 may be referred to as an "ingot notch."

A plurality of semiconductor substrates W may be obtained by repeatedly slicing the ingot 52 along slicing planes 56A, 56B, and 56C inclined by the first off-angle θ in the <110> direction passing through the notch NC with respect to a reference plane 14 that is a (100) crystal plane. The first off-angle θ may be equal to or greater than 0.2° and less than 7.3°.

In embodiments, a treatment process including chamfering, lapping, etching, and mirror polishing for the outer periphery may be performed on each of the plurality of semiconductor substrates WF obtained by the method described with reference to FIGS. 3A and 3B.

Figure 4A:
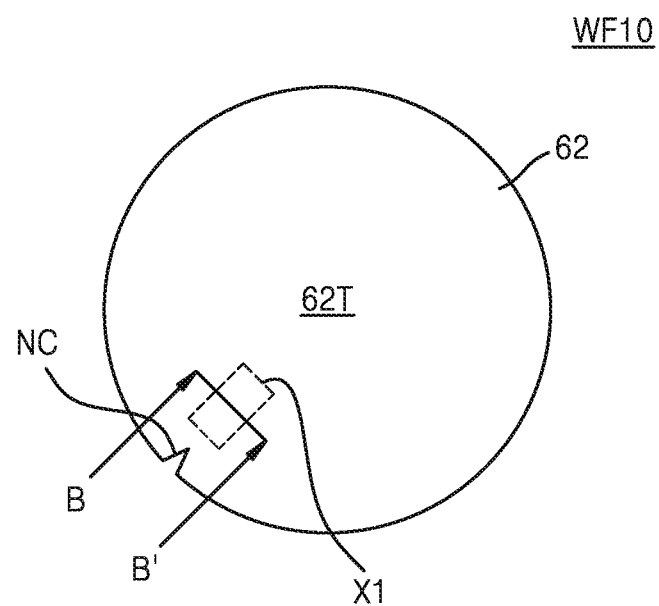
FIG. 4A is a plan view of a semiconductor epitaxial substrate according to embodiments.
Figure 4B:
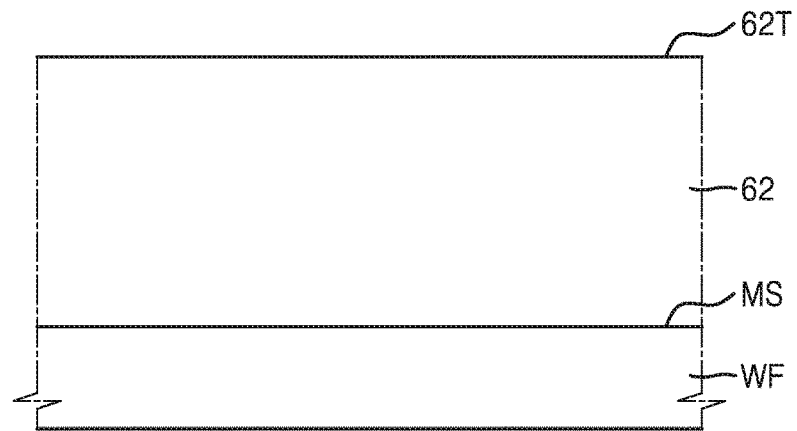
FIG. 4B is an enlarged cross-sectional view taken along a line B-B' in FIG. 4A.
Figure 4C:
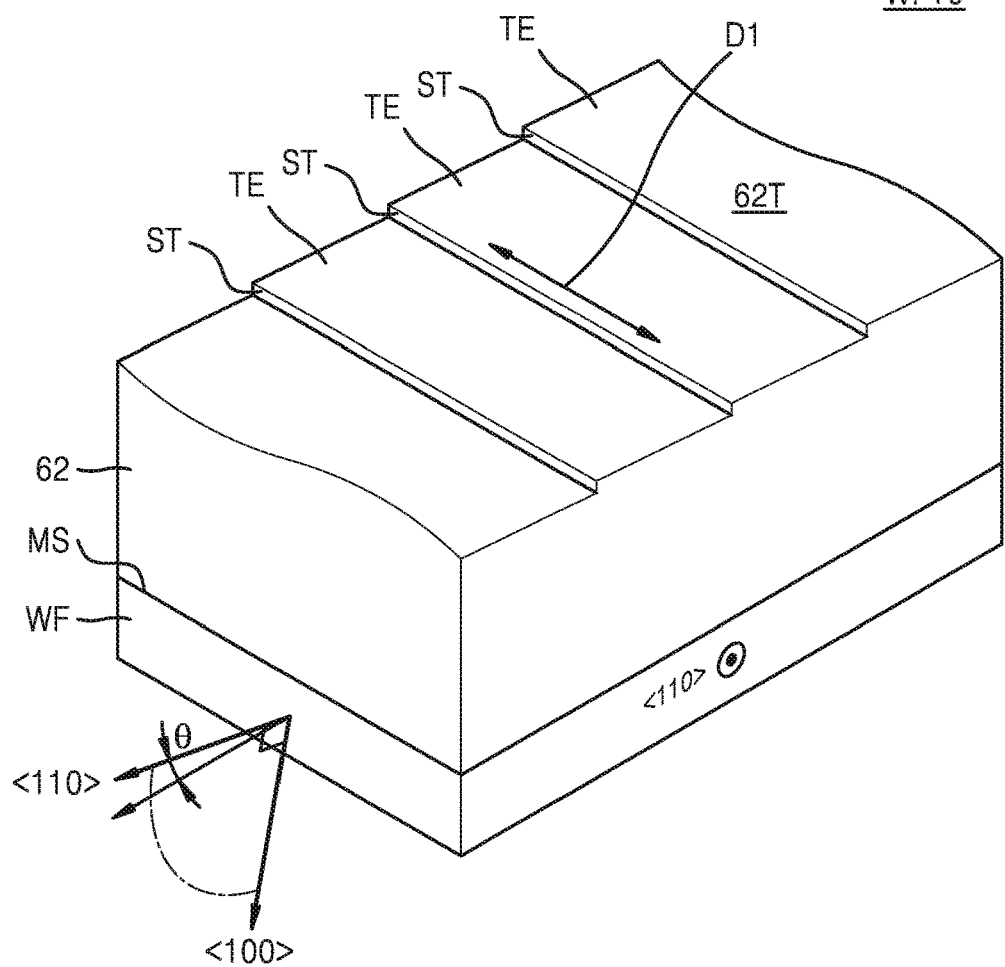
FIG. 4C is an enlarged perspective view of a dashed line area indicated by "X1" in FIG. 4A.

FIG. 4A is a plan view of a semiconductor epitaxial substrate WF10 according to embodiments, FIG. 4B is an enlarged cross-sectional view taken along a line B-B' in FIG. 4A, and FIG. 4C is an enlarged perspective view of a dashed line area indicated by "X1" in FIG. 4A.

Referring to FIGS. 4A to 4C, the semiconductor epitaxial substrate WF10 includes a semiconductor substrate WF and a semiconductor epitaxial layer 62 formed on the main surface MS of the semiconductor substrate WF. A more detailed configuration of the semiconductor substrate WF is as described with reference to FIGS. 1A and 1B.

The semiconductor epitaxial layer 62 has an upper surface 62T on which a plurality of atomic level steps ST is formed. An extending direction D1 of each of the plurality of atomic level steps ST may be parallel to the second straight line L2 (see FIG. 1A) perpendicular to the first straight line L1 (see FIG. 1A) passing through the center C of the main surface MS and the notch NC. In embodiments, at least some of the extending directions D1 of the plurality of atomic level steps ST may not be parallel to other ones. In this case, the extending direction D1 of each of the plurality of atomic level steps ST may be parallel to the second straight line L2 on average.

In embodiments, the plurality of atomic level steps ST formed on the upper surface 62T of the semiconductor epitaxial layer 62 may be formed in the process of epitaxially growing semiconductor atoms, for example, Si atoms, on the main surface MS of the semiconductor substrate WF, which is inclined by the first off-angle θ in the <110> direction parallel to the (100) crystal plane. A flat terrace TE may extend, parallel to the extending direction D1, between the atomic level steps ST formed on the upper surface 62T of the semiconductor epitaxial layer 62. The semiconductor epitaxial layer 62 may include a homoepitaxial layer or a heteroepitaxial layer. In embodiments, the semiconductor epitaxial layer 62 may include Si, SiGe, GaAs, InP, or a combination thereof.

In embodiments, the semiconductor epitaxial layer 62 may be obtained by homoepitaxially growing Si on the semiconductor substrate WF that is a Si single crystal substrate. For example, the semiconductor epitaxial layer 62 may be formed by an epitaxial growth process using a chemical vapor deposition (CVD) apparatus on the main surface MS of the semiconductor substrate WF.

Because the main surface MS of the semiconductor substrate WF is inclined by the first off-angle θ in the <110> direction parallel to the (100) crystal plane and the semiconductor epitaxial layer 62 is formed on the inclined main surface MS of the semiconductor substrate WF, the semiconductor epitaxial layer 62 having improved surface characteristics in terms of haze, surface roughness, and the like may be obtained. When a transistor of an integrated circuit device is formed by using the semiconductor epitaxial substrate WF10, which includes the semiconductor epitaxial layer 62 having improved surface characteristics, as an active region, roughness scattering in a channel region of the transistor may reduce an adverse effect on carriers, and thus high carrier mobility may be realized. Therefore, the performance of the integrated circuit device including the transistor may be improved.

Figure 5A:
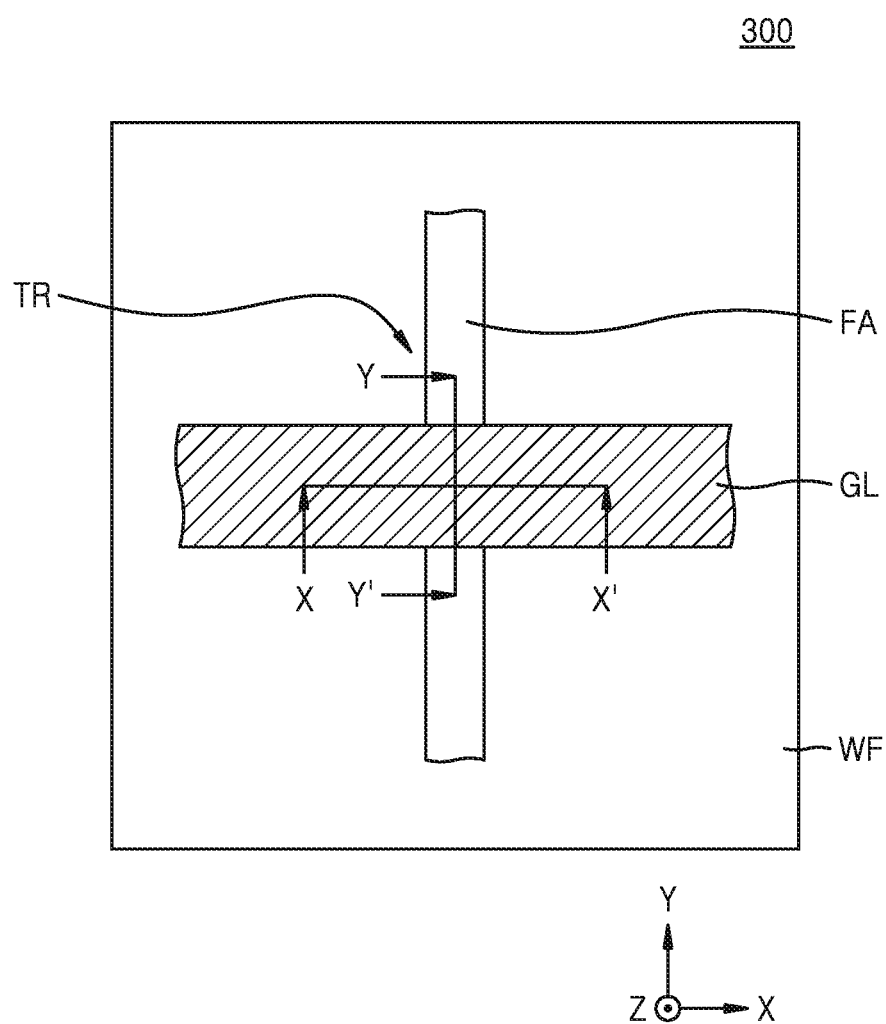
FIGS. 5A, 5B, 5C, 5D and 5E are views illustrating an integrated circuit device according to embodiments.
Figure 5B:
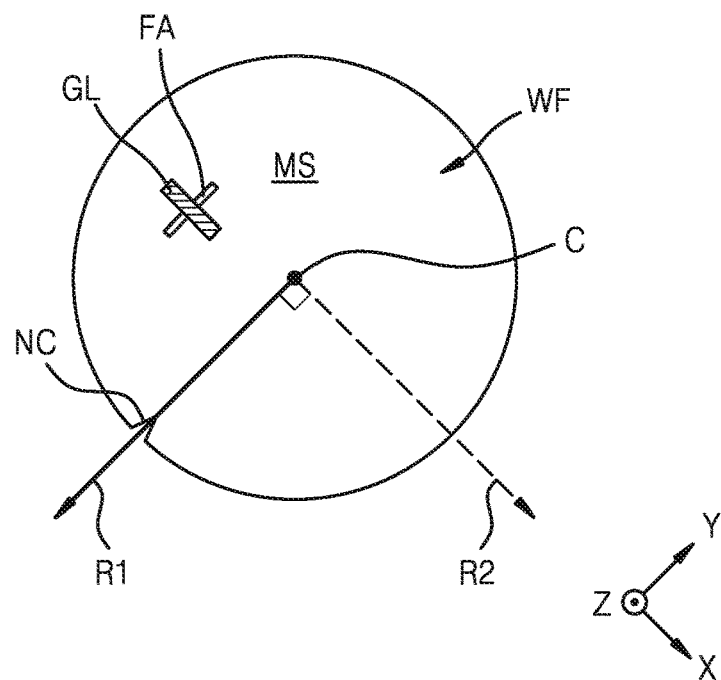
Figure 5C:
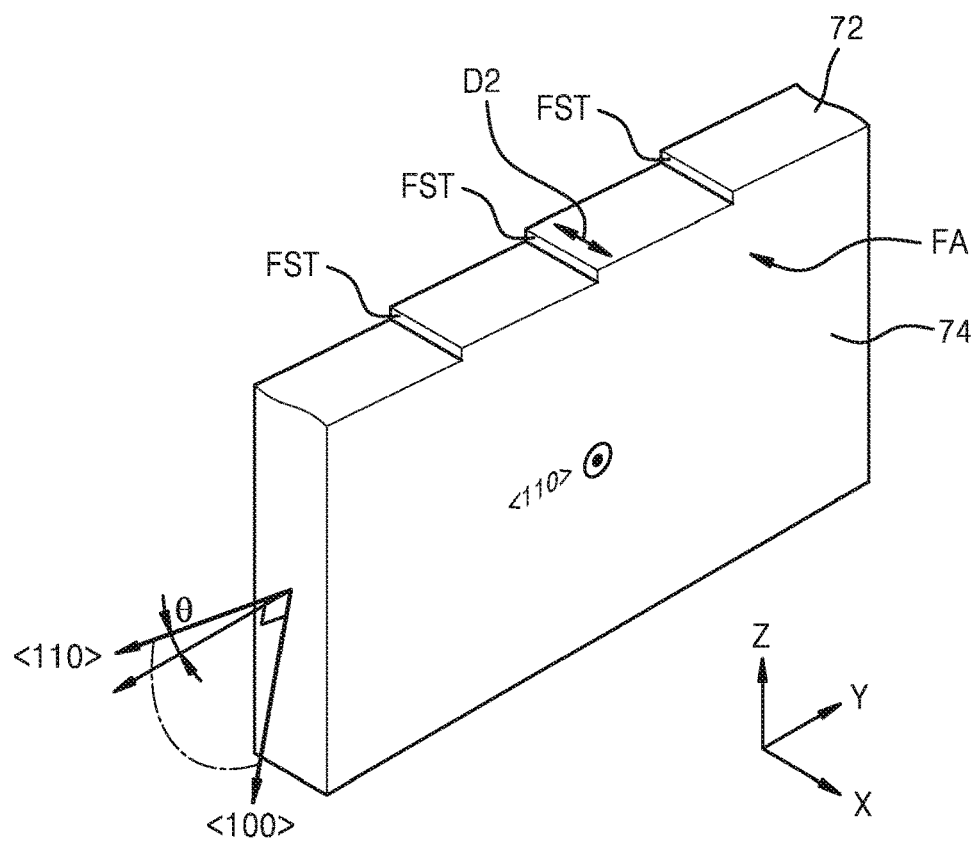
Figure 5D:
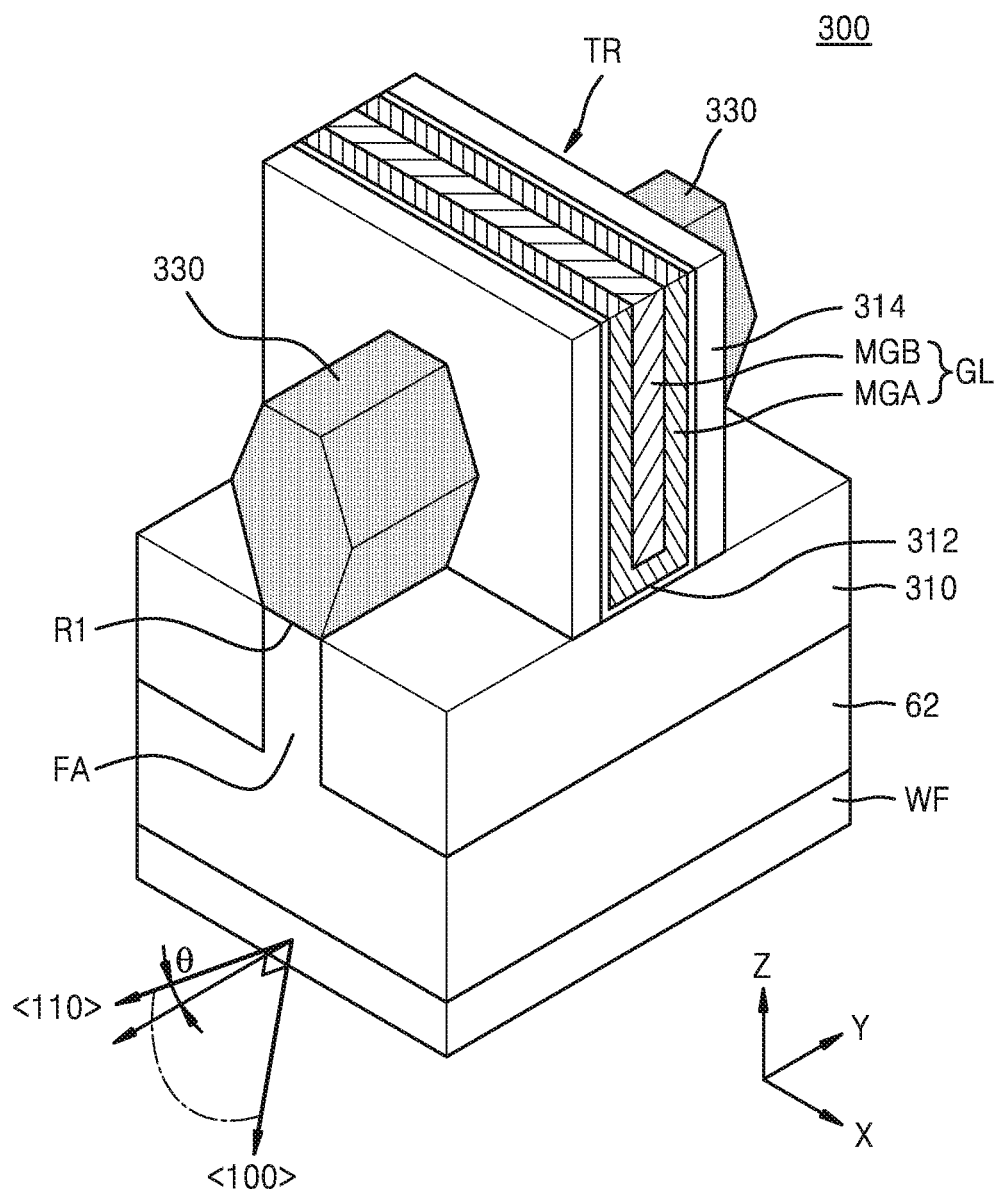
Figure 5E:
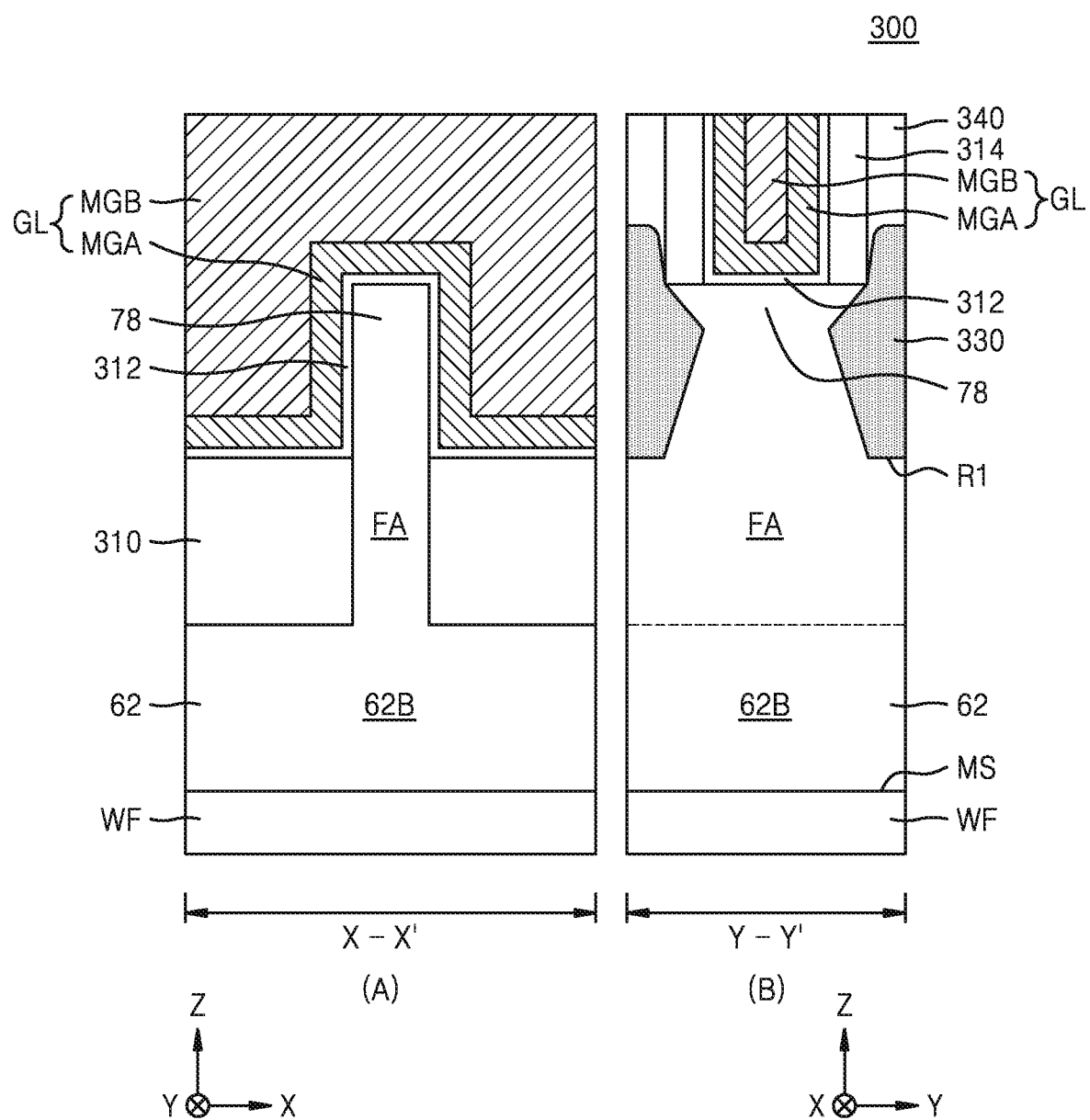

FIGS. 5A to 5E are views illustrating an integrated circuit device according to embodiments. FIG. 5A is a schematic layout of some elements of an integrated circuit device 300 according to embodiments, FIG. 5B is a plan view illustrating relative directions of some elements of the integrated circuit device 300, FIG. 5C is a perspective view of a portion of a fin-type active region FA included in the integrated circuit device 300, FIG. 5D is a perspective view of the integrated circuit device 300, and FIG. 5E is a cross-sectional view of the integrated circuit device 300. Portion (A) of FIG. 5E is a cross-sectional view taken along a line X-X' in FIG. 5A, and portion (B) of FIG. 5E is a cross-sectional view taken along a line Y-Y' in FIG. 5A.

Referring to FIGS. 5A to 5E, the integrated circuit device 300 includes a semiconductor substrate WF and a semiconductor epitaxial layer 62 formed on a main surface MS of the semiconductor substrate WF. The semiconductor epitaxial layer 62 includes a bulk region 62B covering the main surface MS of the semiconductor substrate WF and a fin-type active region FA protruding from the bulk region 62B.

The main surface MS of the semiconductor substrate WF is inclined by a first off-angle θ that is greater than 0° in a <110> direction parallel to a (100) crystal plane with respect to the (100) crystal plane. A more detailed configuration of the semiconductor substrate WF is as described with reference to FIG. 1. A more detailed configuration of the semiconductor epitaxial layer 62 is as described with reference to FIGS. 4A to 4C.

As illustrated in FIG. 5B, the fin-type active region FA located above the main surface MS of the semiconductor substrate WF has a major axis in the longitudinal direction (Y direction) and a minor axis in the width direction (X direction). In the present specification, the longitudinal direction (Y direction) of the fin-type active region FA may be referred to as a major axis direction. The width direction (X direction) of the fin-type active region FA may be referred to as a minor axis direction. The major axis direction of the fin-type active region FA is parallel to a first direction (an arrow R1 direction) passing through the center C of the main surface MS of the semiconductor substrate WF and a notch NC, and the minor axis direction of the fin-type active region FA is parallel to a second direction (an arrow R2 direction) perpendicular to the first direction.

As illustrated in FIG. 5B, the fin-type active region FA in the major axis direction of the fin-type active region FA may be elongated in a direction inclined by the first off-angle θ in the <110> direction parallel to the (100) crystal plane with respect to the (100) crystal plane, similar to the main surface MS of the semiconductor substrate WF. The first off-angle θ may be equal to or greater than 0.2° and less than 7.3°. An upper surface 72 of the fin-type active region FA in the width direction of the fin-type active region FA may extend parallel to the (100) crystal plane.

A plurality of atomic level steps FST may be formed on the upper surface 72 of the fin-type active region FA. An extending direction D2 of each of the plurality of atomic level steps FST may be parallel to the width direction (or the minor axis direction) of the fin-type active region FA. In embodiments, at least some of the extending directions D2 of the plurality of atomic level steps FST may not be parallel to other ones. In this case, the extending direction D2 of each of the plurality of atomic level steps FST may be parallel to the width direction (or the minor axis direction) of the fin-type active region FA on average.

The fin-type active region FA may have both sidewalls 74 including a (110) oriented surface. There may be substantially no atomic level step on both of the sidewalls 74 of the fin-type active region FA. Therefore, crystal defects propagating along a (111) crystal plane from the sidewalls 74 of the fin-type active region FA to the inside of the fin-type active region FA may not be generated.

The fin-type active region FA may include a Si epitaxial layer, a Ge epitaxial layer, a SiGe epitaxial layer, a GaAs epitaxial layer, an InP epitaxial layer, or a combination thereof.

The integrated circuit device 300 may include a device isolation insulating film 310 covering the lower sidewall of the fin-type active region FA. The fin-type active region FA may protrude, in a fin shape, into the device isolation insulating film 310. In embodiments, the device isolation insulating film 310 may include a silicon oxide film, a silicon nitride film, a silicon oxynitride film, or a combination thereof.

A gate line GL may extend in a direction intersecting the fin-type active region FA above the semiconductor epitaxial layer 62. In embodiments, the gate line GL may be elongated in the width direction (or the minor axis direction) of the fin-type active region FA. In embodiments, the gate line GL may be elongated in a direction parallel to a plurality of atomic level steps ST (see FIG. 4C) formed on the main surface MS of the semiconductor substrate WF above the semiconductor substrate WF. In embodiments, the gate line GL may be elongated in a direction parallel to the plurality of atomic level steps FST (see FIG. 5C) formed on the upper surface 72 of the fin-type active region FA.

The gate line GL may cover the upper surface 72 and both of the sidewalls 74 of the fin-type active region FA. The both of the sidewalls 74 of the fin-type active region FA facing the gate line GL may each include a (110) oriented surface.

A recess R1 may be formed on both sides of the gate line GL on the fin-type active region FA. The recess R1 may be filled with a pair of source and drain regions 330. The pair of source and drain regions 330 on both sides of the gate line GL may be spaced apart from each other in a direction, which is perpendicular to the extending directions D2 of the plurality of atomic level steps FST formed on the upper surface 72 of the fin-type active region FA, with the gate line GL interposed between the pair of source and drain regions 330. The pair of source and drain regions 330 may include a semiconductor layer epitaxially grown from the fin-type active region FA. The pair of source and drain regions 330 may each include an epitaxially grown SiGe layer, an epitaxially grown Si layer, or an epitaxially grown SiC layer.

The fin-type active region FA may include a channel region 78 between the pair of source and drain regions 330 that are spaced apart with the gate line GL therebetween. The channel region 78 may be configured such that carriers flow in the <110> direction.

A gate dielectric film 312 is between the channel region 78 of the fin-type active region FA and the gate line GL. The gate dielectric film 312 may include an oxide film, a nitride film, an oxynitride film, a high dielectric constant film, or a combination thereof. The high dielectric constant film may include a metal oxide or a metal oxynitride that has a dielectric constant of about 10 to about 25. For example, the high dielectric constant film may include hafnium oxide, hafnium oxynitride, hafnium silicon oxide, zirconium oxide, or zirconium silicon oxide. However, the inventive concept is not limited thereto.

The gate line GL may include a first metal-containing layer MGA and a second metal-containing layer MGB. The first metal-containing layer MGA may control a work function. The second metal-containing layer MGB may fill a space formed on the first metal-containing layer MGA. In embodiments, the first metal-containing layer MGA may include a metal including Ti, Ta, Al, and/or a combination thereof. The second metal-containing layer MGB may include an upper work function control film, a conductive barrier film, a gap-fill metal film, or a combination thereof. The upper work function control film may include TiAl, TiAlC, TiAlN, TiC, TaC, HfSi, or a combination thereof. The conductive barrier film may include a metal nitride, for example, TiN, TaN, or a combination thereof. The gap-fill metal film may be formed to fill a gate space remaining on the conductive barrier film. In embodiments, the gap-fill metal film may include W. In embodiments, any one or any combination of the upper work function control film, the conductive barrier film, and the gap-fill metal film may be omitted. For example, the gate line GL may have a stacked structure of TiAlC/TiN/W, a stacked structure of TiN/TaN/TiAlC/TiN/W, or a stacked structure of TiN/TaN/TiN/TiAlC/TiN/W. In the above stacked structures, a TiAlC layer or a TiN layer may serve as a metal-containing layer for controlling a work function.

Both sidewalls of the gate line GL may be covered with a gate insulating spacer 314. The gate dielectric film 312 may extend between the fin-type active region FA and the gate line GL and between the gate line GL and the gate insulating spacer 314. The gate insulating spacer 314 may include SiN, SiOCN, SiCN, or a combination thereof. The pair of source and drain regions 330 and the gate line GL may be insulated from each other by the gate insulating spacer 314 therebetween.

The pair of source and drain regions 330 may be covered with an inter-gate insulating film 340. The inter-gate insulating film 340 may include a silicon oxide film, a silicon nitride film, or a combination thereof.

A transistor TR may be formed at a position where the fin-type active region FA and the gate line GL intersect each other. The transistor TR may have a three-dimensional structure in which channels are formed on the upper surface and both sides of the fin-type active region FA. The transistor TR may constitute an NMOS transistor or a PMOS transistor. The transistor TR may constitute a memory device or a non-memory device. In embodiments, the transistor TR may constitute a dynamic random access memory (DRAM) device, a static RAM (SRAM) device, a magnetic RAM (MRAM) device, a resistance RAM (RRAM) device, a phase change RAM (PRAM) device, or a ferroelectric RAM (FRAM) device. In some other embodiments, the transistor TR may constitute a logic device. In some other embodiments, the transistor TR may constitute an image sensor such as a CMOS imaging sensor (CIS), a system large scale integration (LSI) device, microelectromechanical systems (MEMS), an active device, a solar cell, or a passive device.

In the integrated circuit device 300, the fin-type active region FA is obtained from the semiconductor epitaxial layer 62 formed on the semiconductor substrate WF inclined by the first off-angle $\theta$ that is greater than 0° in the <110> direction parallel to the (100) crystal plane with respect to the (100) crystal plane. Therefore, the fin-type active region FA may be elongated in a direction inclined by the first off-angle $\theta$ in the <110> direction parallel to the (100) crystal plane, and both of the sidewalls 74 of the fin-type active region FA may be formed of a (110) oriented surface. Therefore, a fraction occupied by the (111) crystal plane that is vulnerable to crystal defect propagation, in the fin-type active region FA, may be minimized.

An atomic level step FST extending in the minor axis direction of the fin-type active region FA may be formed on the upper surface 72 of the fin-type active region FA, but there may be substantially no atomic level step on the sidewalls 74 of the fin-type active region FA. Therefore, there is no risk of crystal defects propagating along the (111) crystal plane from the sidewalls 74 of the fin-type active region FA to the inside of the fin-type active region FA due to the atomic level step. In addition, even if there is a surface defect other than the atomic level step in the sidewalls 74 of the fin-type active region FA, because the fin-type active region FA has a structure in which a fraction occupied by the (111) crystal plane in the fin-type active region FA is minimized as described above, the occurrence of crystal defects, which propagate along the (111) crystal plane from the sidewalls 74 of the fin-type active region FA to the inside of the fin-type active region FA due to a surface defect in the sidewalls 74 of the fin-type active region FA, may be minimized. Therefore, the possibility of occurrence of defects due to the occurrence of crystal defects in the integrated circuit device 300 may be minimized.

Although one fin-type active region FA and one gate line GL are illustrated in FIGS. 5A to 5E, the integrated circuit device 300 may include a plurality of fin-type active regions FA arranged parallel to one another on the main surface MS of the semiconductor substrate WF, and a plurality of gate lines GL extending in a direction intersecting the plurality of fin-type active regions FA on the plurality of fin-type active regions FA. Each of the plurality of fin-type active regions FA may have the same configuration as the fin-type active region FA described with reference to FIGS. 5A to 5E.

Figure 6A:
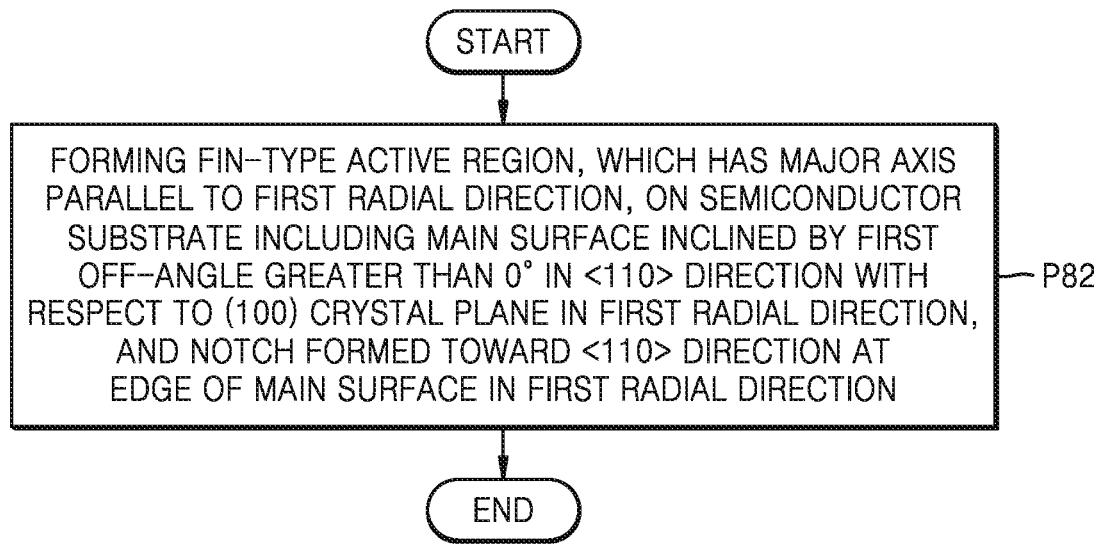
FIG. 6A is a flowchart illustrating a method of manufacturing an integrated circuit device, according to embodiments.

FIG. 6A is a flowchart illustrating a method of manufacturing an integrated circuit device, according to embodiments.

Referring to FIGS. 1A, 1B, 5A to 5E, and 6A, in operation P82, a fin-type active region FA having a major axis parallel to a first radial direction is formed on a semiconductor substrate WF that includes a main surface MS and a notch NC. The main surface MS is inclined by a first off-angle θ, which is greater than 0° in a <110> direction parallel to a (100) crystal plane, with respect to the (100) crystal plane in the first radial direction (the arrow R1 direction in FIGS. 1A and 1B). The notch NC is formed toward the <110> direction at an edge of the main surface MS in the first radial direction.

In embodiments, the first off-angle θ may be equal to or greater than 0.2° and less than 7.3°. In embodiments, in the semiconductor substrate WF, a second off-angle of the main surface MS with respect to the (100) crystal plane in a second radial direction (the arrow R2 direction in FIGS. 1A and 1B) perpendicular to the first radial direction may be 0°.

As described with reference to FIG. 1A, a first normal N1 to the main surface MS of the semiconductor substrate WF may be inclined by the first off-angle θ that is greater than 0° in a direction toward the notch NC from a second normal N2 to the (100) crystal plane.

In embodiments, to form the semiconductor substrate WF, an ingot 52 grown in the <100> direction and having the notch NC formed in the <110> direction and extending along a longitudinal direction on the outer circumference, as described above with reference to FIGS. 3A and 3B, may be prepared, and then the ingot 52 may be repeatedly sliced along slicing planes 56A, 56B, and 56C inclined by the first off-angle θ in the <110> direction passing through the notch NC with respect to the (100) crystal plane.

Figure 6B:
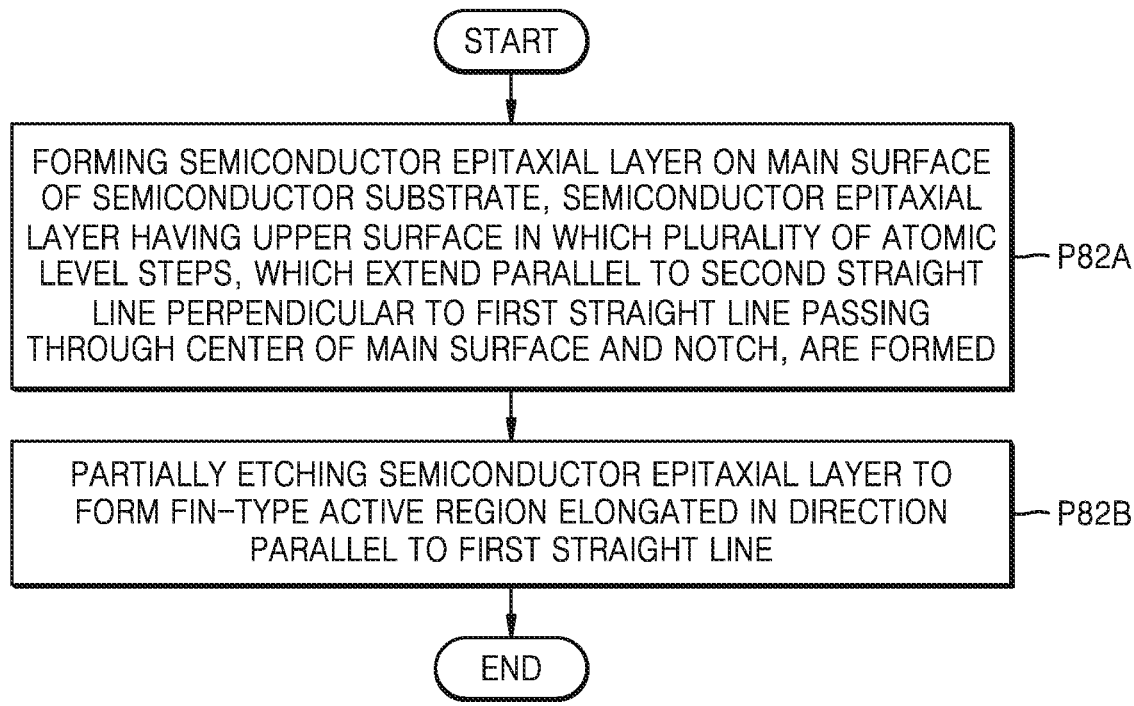
FIG. 6B is a flowchart illustrating a method of manufacturing an integrated circuit device, according to embodiments.

FIG. 6B is a flowchart illustrating a method of manufacturing an integrated circuit device, according to another embodiment of the inventive concept. An example of a method of forming a fin-type active region according to operation P82 of FIG. 6A will be described with reference to FIG. 6B.

Referring to FIGS. 4A to 4C, 5A to 5E, and 6B, in operation P82A, a semiconductor epitaxial layer 62 having an upper surface 62T in which a plurality of atomic level steps ST (see FIG. 4C) are formed is formed on a main surface MS of a semiconductor substrate WF. The plurality of atomic level steps ST extend parallel to a second straight line (a straight line along the arrow R2 direction in FIG. 5B) perpendicular to a first straight line (a straight line along the arrow R1 direction in FIG. 5B) passing through the center C of a main surface MS of the semiconductor substrate WF and a notch NC. An epitaxial growth process may be performed using a CVD apparatus to form the semiconductor epitaxial layer 62.

In operation P82B, the semiconductor epitaxial layer 62 is partially etched to form a fin-type active region FA having a major axis parallel to the first straight line.

In embodiments, the fin-type active region FA may be formed such that the upper surface 72 of the fin-type active region FA includes at least one atomic level step FST as described with reference to FIG. 5C.

Figure 7:
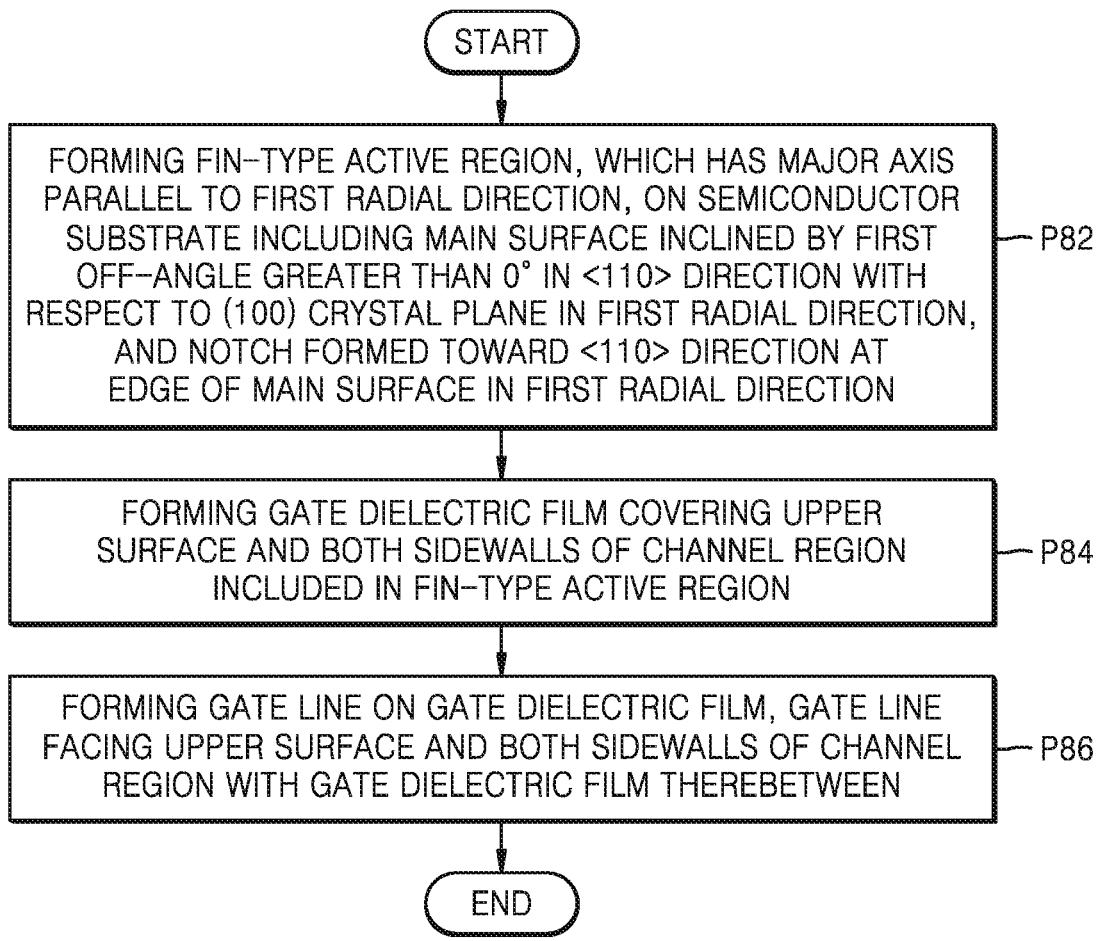
FIG. 7 is a flowchart illustrating a method of manufacturing an integrated circuit device, according to embodiments.

FIG. 7 is a flowchart illustrating a method of manufacturing an integrated circuit device, according to another embodiment of the inventive concept.

Referring to FIGS. 5A to 5E and 7, after operation P82 described with reference to FIG. 6A is performed, a gate dielectric film 312 is formed, in operation P84, to cover the upper surface 72 and both sidewalls 74 of a channel region 78 included in the fin-type active region FA.

In operation P86, a gate line GL, which faces the upper surface 72 and the both of the sidewalls 74 of the channel region 78 with the gate dielectric film 312 therebetween, is formed on the gate dielectric film 312.

FIGS. 8A to 8F are cross-sectional views illustrating, according a process sequence, a method of manufacturing an integrated circuit device, according to another embodiment of the inventive concept. An example of a method of manufacturing the integrated circuit device 300 illustrated in FIGS. 5A to 5E will be described with reference to FIGS. 8A to 8F. In FIGS. 8A to 8F, the same reference numerals as in FIGS. 5A to 5E denote the same members, and repeated descriptions thereof will be omitted.

Figure 8A:
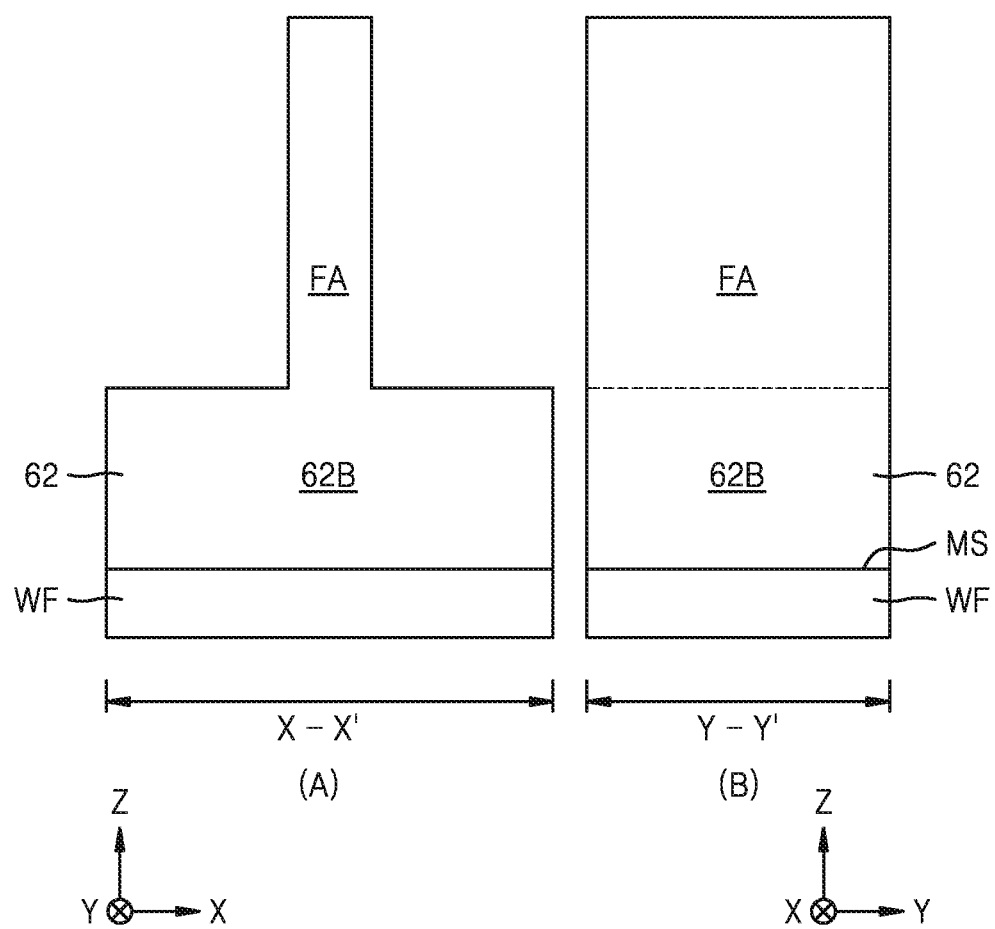
FIGS. 8A, 8B, 8C, 8D, 8E and 8F are cross-sectional views illustrating, according a process sequence, a method of manufacturing an integrated circuit device, according to embodiments.

Referring to FIG. 8A, after a semiconductor epitaxial substrate WF10 having a semiconductor epitaxial layer 62 formed on a main surface MS of a semiconductor substrate WF is formed as described with reference to FIGS. 4A to 4C, the semiconductor epitaxial layer 62 is partially etched to form a fin-type active region FA. The fin-type active region FA may have a structure elongated in the Y direction on the main surface MS of the semiconductor substrate WF.

Figure 8B:
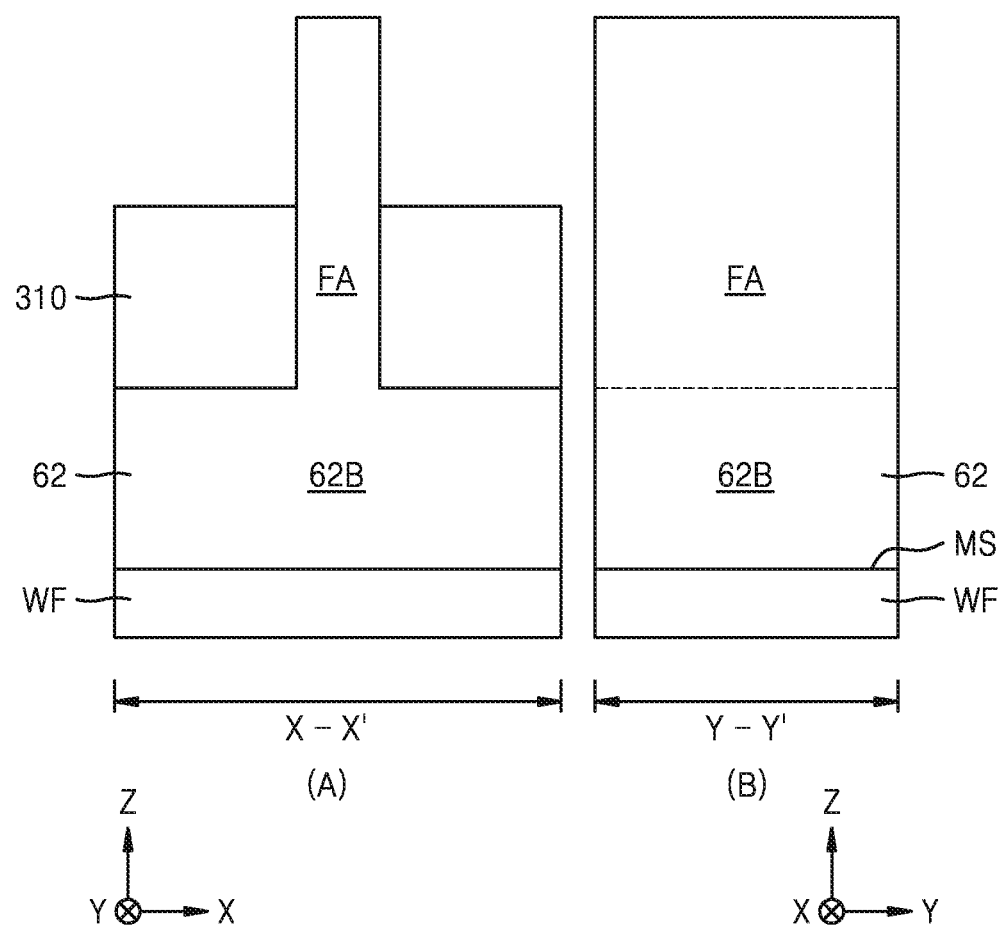

Referring to FIG. 8B, a device isolation insulating film 310 is formed to cover lower portions of the both sidewalls of the fin-type active region FA. After the device isolation insulating film 310 is formed, an upper portion of the fin-type active region FA may protrude on the device isolation insulating film 310.

Figure 8C:
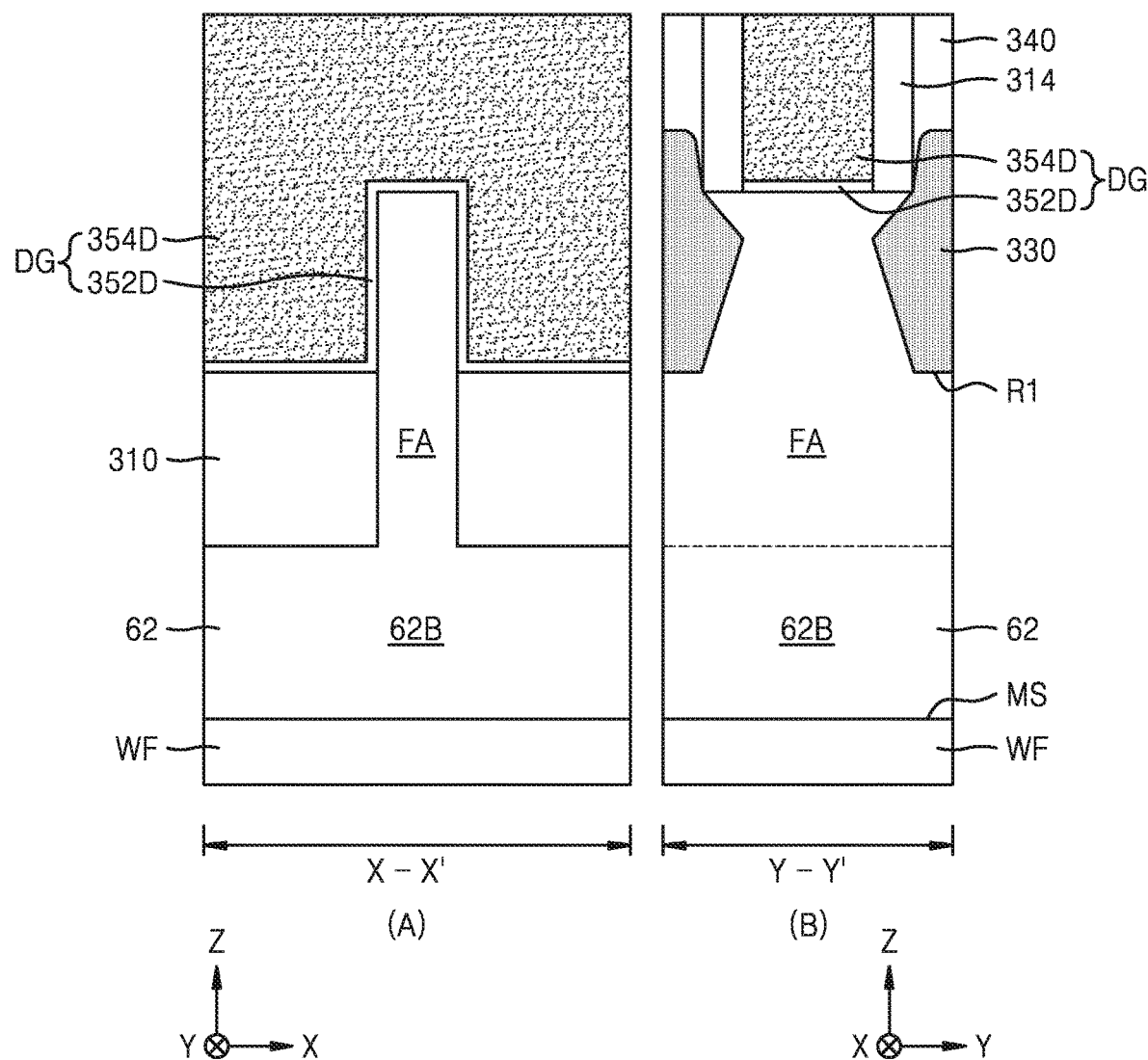

Referring to FIG. 8C, a dummy gate structure DG is formed to cover the protruding upper portion of the fin-type active region FA. The dummy gate structure DG may include a dummy gate dielectric film 352D and a dummy gate electrode 354D. A gate insulating spacer 314 is formed to cover both sidewalls of the dummy gate structure DG, and then, in the fin-type active region FA, source and drain regions 330 is formed on both sides of the dummy gate structure DG and an inter-gate insulating film 340 is formed to cover the source and drain regions 330 on both sides of the dummy gate structure DG.

The dummy gate structure DG may extend in a direction (X direction) intersecting a direction of the extension of the fin-type active region FA. In embodiments, the dummy gate dielectric film 352D may include a silicon oxide film, and the dummy gate electrode 354D may include polysilicon.

Figure 8D:
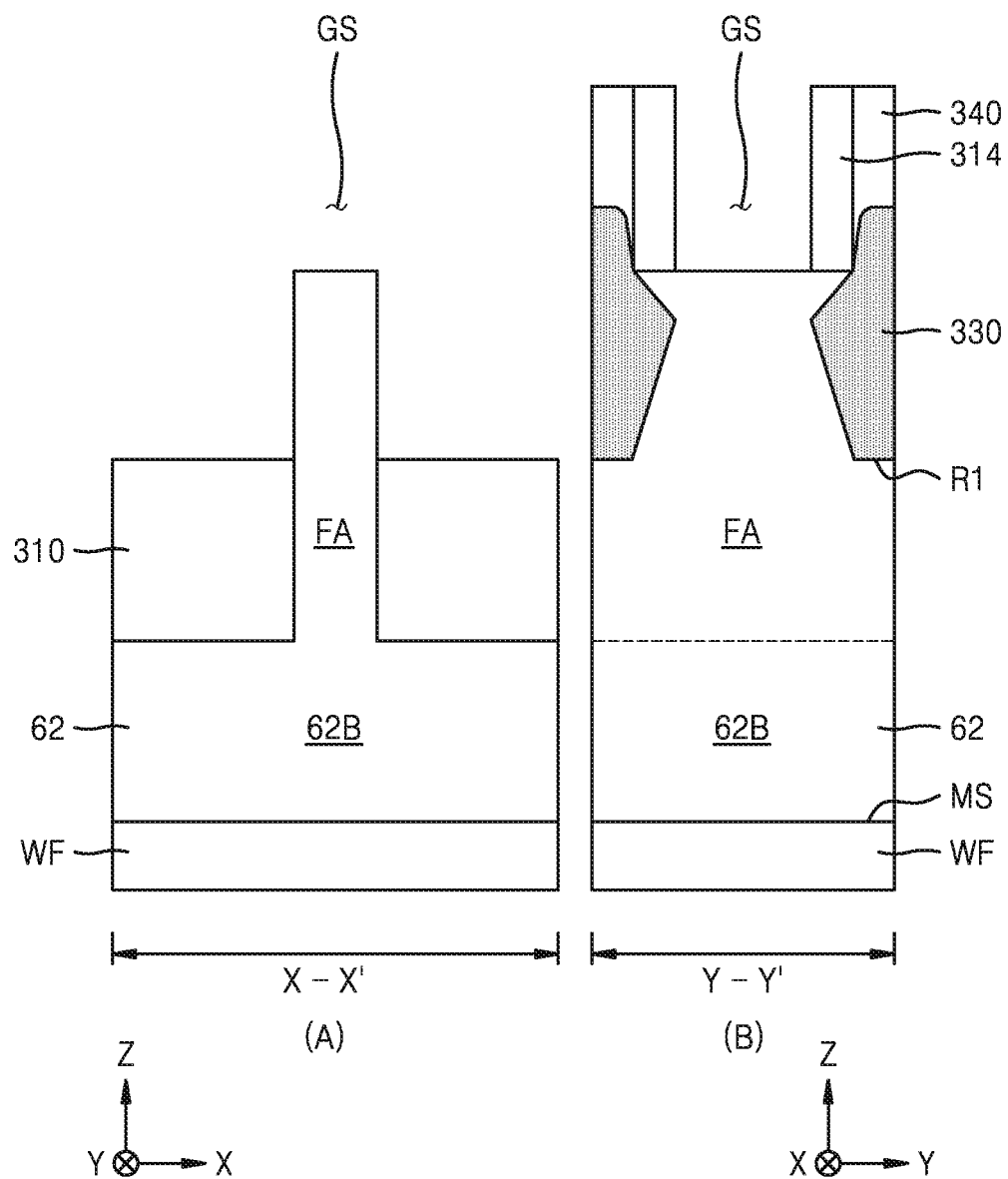

Referring to FIG. 8D, the dummy gate structure DG exposed through the inter-gate insulating film 340 is removed to provide a gate space GS between a pair of insulating spacers 314. An upper portion of the fin-type active region FA may be exposed through the gate space GS.

Figure 8E:
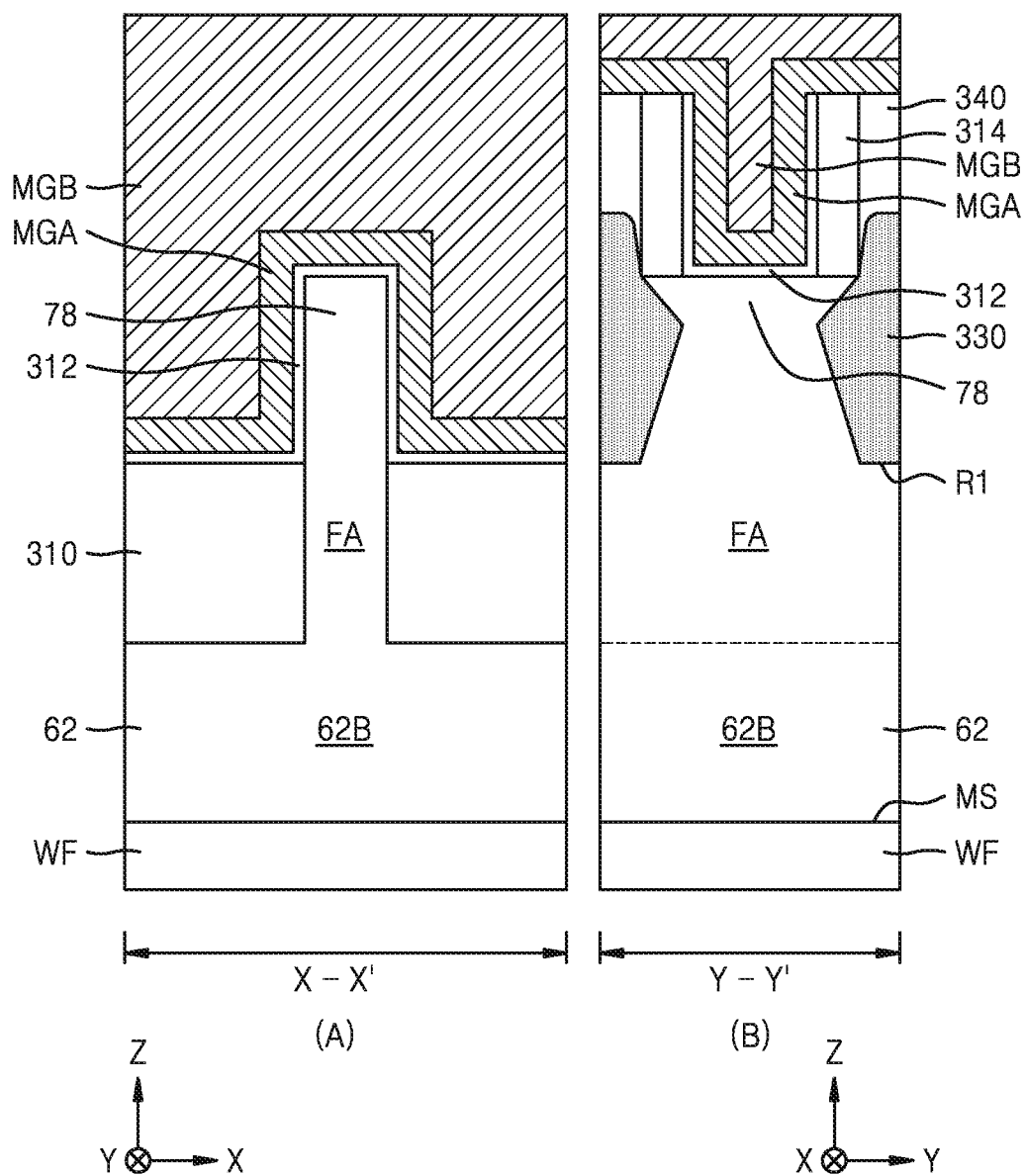

Referring to FIG. 8E, a gate dielectric film 312 is formed to conformally cover the surface of the fin-type active region FA and the surface of the device isolation insulating film 310 that are exposed through the gate space GS in the resultant structure of FIG. 8D, and a first metal-containing layer MGA and a second metal-containing layer MGB are formed over the gate dielectric film 312.

Figure 8F:
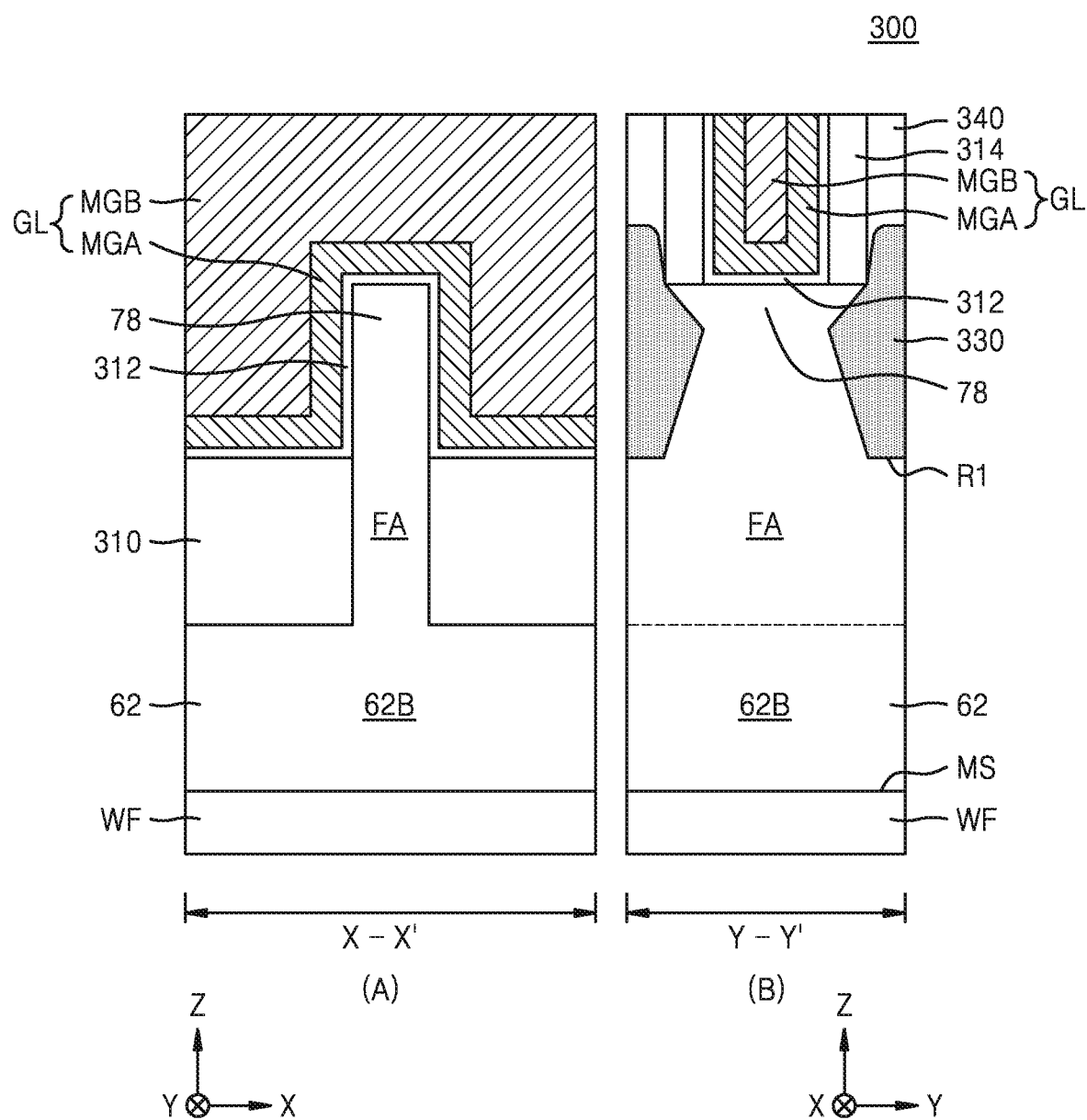

Referring to FIG. 8F, unnecessary portions of the gate dielectric film 312, the first metal-containing layer MGA, and the second metal-containing layer MGB are removed by a planarization process, for example, a chemical mechanical polishing process such that the upper surface of the inter-gate insulating film 340 is exposed and a portion of each of the gate dielectric film 312, the first metal-containing layer MGA, and the second metal-containing layer MGB remains in the gate space GS. As a result, a gate line GL filling the gate space GS may be obtained.

While the inventive concept has been shown and described with reference to embodiments thereof, it will be understood that various changes in form and details may be made therein without departing from the spirit and scope of the following claims.

What is claimed is:

1. A semiconductor substrate comprising:
   a crystal plane inside the semiconductor substrate;
   a main surface inclined by a first off-angle greater than 0° from a first direction parallel to the crystal plane, with respect to the crystal plane, in a first radial direction of the main surface; and
   a notch disposed in a direction toward the first direction from a center of the crystal plane, at an intersection between the first radial direction and an edge of the main surface in the first radial direction,
   wherein the semiconductor substrate is a silicon single crystal substrate,
   wherein a first straight line passing through a center of the main surface and the notch is inclined by the first off-angle from a different straight line extending in the first direction from the center of the crystal plane,
   wherein, in a second radial direction of the main surface, the second radial direction being perpendicular to the first radial direction, a second off-angle of the main surface with respect to the crystal plane is 0°, and
   wherein the crystal plane is a (100) crystal plane, and the first direction is a <110> direction.

2. The semiconductor substrate of claim 1, wherein the first off-angle is equal to or greater than 0.2° and less than 7.3°.

3. The semiconductor substrate of claim 1, wherein a first normal to the main surface of the semiconductor substrate is inclined by the first off-angle equal to or greater than 0.2° and less than 7.3°, in a second direction toward the notch, from a second normal to the crystal plane.

4. A semiconductor epitaxial substrate comprising:
   the semiconductor substrate of claim 1; and
   a semiconductor epitaxial layer disposed on the main surface, and comprises an upper surface comprising atomic level steps,
   wherein the atomic level steps extend parallel to a second straight line perpendicular to the first straight line.

5. The semiconductor epitaxial substrate of claim 4, wherein the semiconductor epitaxial layer comprises any one or any combination of Si, SiGe, GaAs, and InP.

6. An integrated circuit device comprising:
   a semiconductor substrate comprising:
      a crystal plane inside the semiconductor substrate;
      a main surface inclined by a first off-angle greater than 0° from a first direction parallel to the crystal plane, with respect to the crystal plane, in a first radial direction of the main surface, wherein the main surface is parallel to the crystal plane, in a second radial direction of the main surface, the second radial direction being perpendicular to the first radial direction; and
      a notch disposed in a direction toward the first direction from a center of the crystal plane, at an intersection between the first radial direction and an edge of the main surface in the first radial direction, wherein a first straight line passing through a center of the main surface and the notch is inclined by the first off-angle from a different straight line extending in the first direction from the center of the crystal plane; and
   a fin-type active region disposed on the main surface, and has a major axis parallel to the first radial direction and a minor axis parallel to the second radial direction,
   wherein the semiconductor substrate is a silicon single crystal substrate,
   wherein the fin-type active region comprises an upper surface comprising an atomic level step,
   wherein the atomic level step extends parallel to the second radial direction, and
   wherein the crystal plane is a (100) crystal plane, and the first direction is a <110> direction.

7. The integrated circuit device of claim 6, wherein the fin-type active region is elongated in the first radial direction inclined by the first off-angle from the first direction parallel to the crystal plane, with respect to the crystal plane.

8. The integrated circuit device of claim 6, wherein the fin-type active region comprises a sidewall comprising an oriented surface.

9. The integrated circuit device of claim 6, wherein the fin-type active region comprises any one or any combination of an Si epitaxial layer, a Ge epitaxial layer, a SiGe epitaxial layer, a GaAs epitaxial layer, and an InP epitaxial layer.

10. The integrated circuit device of claim 6, wherein the fin-type active region comprises a channel region configured such that carriers flow in the first direction.

11. The integrated circuit device of claim 6, further comprising:
    a gate line extending in a minor axis direction of the fin-type active region, and disposed on the semiconductor substrate,
    wherein the gate line faces a sidewall of the fin-type active region, and
    wherein the sidewall comprises an oriented surface.

12. The integrated circuit device of claim 11, further comprising a source region and a drain region disposed respectively on sides of the gate line and above the fin-type active region, wherein the source region is spaced apart from the drain region in a different direction perpendicular to an extending direction of the atomic level step.

13. A semiconductor substrate comprising:
    a crystal plane inside the semiconductor substrate, the semiconductor substrate being a silicon single crystal substrate; and
    a main surface inclined by a first off-angle greater than 0° from a first direction parallel to the crystal plane, with respect to the crystal plane, in a first radial direction of the main surface, wherein the main surface is parallel to the crystal plane, in a second radial direction of the main surface, the second radial direction being perpendicular to the first radial direction; and
    a notch disposed in a direction toward the first direction from a center of the crystal plane, at an intersection between the first radial direction and an edge of the main surface in the first radial direction, wherein a first straight line passing through a center of the main surface and the notch is inclined by the first off-angle from a different straight line extending in the first direction from the center of the crystal plane, wherein the crystal plane is a (100) crystal plane, and the first direction is a <110> direction.

14. The semiconductor substrate of claim 13, wherein the first off-angle is equal to or greater than 0.2° and less than 7.3°.

* * * * *